Jan. 5, 1965 H. W. LOEB ETAL 3,164,498

METHOD OF MANUFACTURING TRANSISTORS

Filed April 10, 1962

INVENTOR
HANS W. LOEB
MERVYN C. LOVELL
BY
Frank R. Jerifari
AGENT

United States Patent Office 3,164,498

Patented Jan. 5, 1965

3,164,498

METHOD OF MANUFACTURING TRANSISTORS

Hans Walter Loeb, London, and Mervyn Charles Lovell, Faringdon, England, assignors to North American Philips Company, Inc., New York, N.Y., a corporation of Delaware Filed Apr. 10, 1962, Ser. No. 186,384
Claims priority, application Great Britain Apr. 10, 1961
8 Claims. (Cl. 148—177)

Figures 1A, 1B:
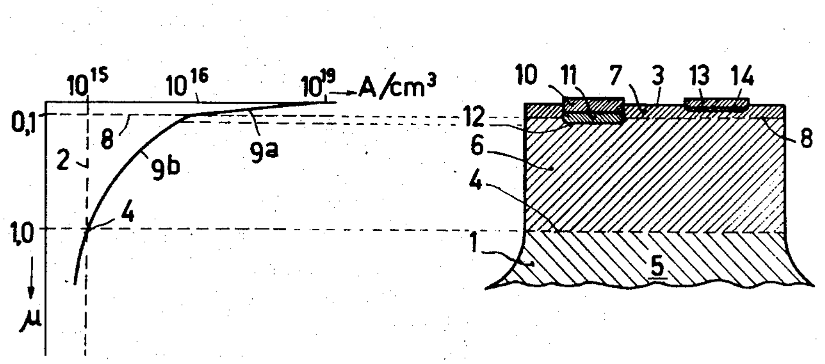

The invention relates to a method of manufacturing a transistor, in which by the diffusion of an impurity of the one conductivity type into a semi-conductor body of the other conductivity type at least part of the base zone of the one conductivity type and a collector junction to the remainder of the body of the other conductivity type are formed, after which on one side of the body on the base zone, side by side an emitter contact with the associated emitter zone of the other conductivity type and a base contact are provided. The invention furthermore relates to a transistor manufactured by this method.

This method is employed, inter alia, frequently in the manufacture of high-frequency transistors having a small thickness of the base zone. Apart from this thickness of the base the emitter injection efficiency and the base resistance are important for the satisfactory operation of the transistor. For an economical mass production a high degree of reproduceability should be attainable for said magnitudes. With the known diffusion transistors in which the diffusion layer has an impurity concentration which decreases continuously and uniformly from the surface, for example along an exponential curve or in accordance with the Gauss error function towards the collector junction it appears that in practice, also with a view to the simplicity and the reproduceability in the manufacture, a compromise must be found with respect to the quality of the emitter injection efficiency and the base resistance. With an excessively steep decrease in the concentration in the diffusion layer the penetration depth of the emitter zone, when the emitter is alloyed, becomes a critical magnitude, which has an unfavourable effect on the reproduceability of the emitter injection efficiency and may give rise to unfavourable values of the said magnitudes. However, an excessively small concentration slope in the diffusion layer may give rise to an excessively high base resistance.

The invention has for its object to provide, inter alia, a simple method suitable for mass production, in which an advantageous compromise with respect to reproduceability, emitter injection efficiency and base resistance can be obtained.

With the method of the kind set forth according to the invention, the base zone is obtained in at least two steps, during the first of which steps by the diffusion of an impurity of the one conductivity type a layer intended for the base zone is provided in the semi-conductor body of the other type, whilst during a subsequent, second step said layer is provided with a surface layer having an increased impurity concentration of the one type as compared with that of the first layer and having a thickness smaller than that of said first layer. When alloying the emitter zone and the emitter contact the emitter zone is applied through the surface layer with the increased concentration into the first-mentioned diffusion layer. The base contact is provided in a conventional manner at the side of the emitter contact, so that via the surface layer of higher concentration a low base resistance is obtained. Since the emitter zone penetrates into the first layer with the low concentration, a satisfactory emitter injection efficiency can be obtained practically independently of the base resistance. Since in the first layer the concentration drop may be small, whilst yet a low base resistance via the surface layer of higher concentration can be obtained, the penetration depth of the emitter zone is less critical, so that the reproduceability is enhanced.

The second step for applying the surface layer with the higher concentration is preferably also formed by the diffusion of an impurity of the one type, which is diffused to this end into the surface of the first diffusion layer with a higher surface concentration and a smaller penetration depth than the first diffusion treatment. With the two diffusion steps use is preferably made of the same impurity of the one type, although within the scope of the invention there is a possibility of using two different impurities of the one type. With a p-type germanium body use is for example made of arsenic as the diffusing donor impurity.

The thin surface layer of higher concentration is preferably arranged in the first diffusion layer by heating, during the second diffusion step, the source of the impurity of the one type at a higher temperature than with the first diffusion step, so that the vapour pressure and hence the surface concentration are higher while the second diffusion step is carried out for a considerably shorter time. The second diffusion step may directly follow the first diffusion step and may be formed by a temporary increase of the temperature of the source. With the use of a p-type germanium wafer and of arsenic as the impurity it has been found to be particularly efficacious to carry out the first diffusion step for about one hour at a temperature of the germanium of about 700° C. and a temperature of the source of arsenic of about 50° C. to 100° C., whilst the second diffusion step takes about 5 to 10 minutes at a temperature of about 700° C. for the germanium and of about 300° C. for the source of arsenic. When using a germanium semiconductor body the p-type emitter material is preferably aluminum and the base contact material is preferably an antimony-gold alloy.

The application of the surface layer of higher concentration may be carried out with similar advantages in a different manner. In this respect it has been found to be also particularly efficacious to grow this surface layer by epitaxial agency from the vapour or the melt containing semi-conductor material. To this end germanium with a high impurity concentration of the one type can be applied by vaporisation to the first layer or be deposited on said layer by thermal dissociation of germanium compounds. As an alternative, this surface layer may be grown from the melt. To this end the semi-conductor germanium body with the first diffusion layer is arranged, for example, in an obliquely disposed tube, having at its bottom a quantity of a lead-tin alloy with arsenic as an impurity. The tube is heated at about 600° C. for melting the lead-tin alloy and it is subsequently moved to the horizontal position to cause the melt to flow across the first diffusion layer of the germanium body. The temperature can then be raised for example to 650° C. for cleaning the germanium surface and to dissolve a thin surface layer, after which said temperature is reduced to about 450° C. Thus a surface layer with a high concentration of the arsenic from the melt is deposited from the melt. By moving the tube again into the oblique position the melt flows from the germanium surface.

The method according to the invention is preferably carried out so that the surface layer of higher concentration has approximately one tenth of the thickness of the base zone, while the emitter zone is alloyed across the surface layer over a depth approximately half the thickness of the surface layer. The concentration of the impurity of the one type in the surface layer lies preferably in the region from $10^{19}$ to $10^{16}$ atoms/cm.$^3$, whereas the concentration range of the underlying part of the base zone is preferably from $10^{16}$ to $10^{15}$ atoms/cm.$^3$. These values appear to be particularly favourable to the reproduceability, the emitter injection efficiency and the base resistance.

The invention furthermore relates to a transistor manufactured by carrying out any of the methods according to the invention.

The invention will now be described more fully with reference to three figures and one embodiment.

FIG. 1a shows a graph in which the concentration of the impurity in atoms/cm.$^3$ is plotted on the abscissa and the penetration depth D from the surface is plotted on the ordinate, which concentration distribution is obtained in a transistor manufactured by the method according to the invention, which transistor is shown diagrammatically in a sectional view as far as the part essential for the invention is concerned.

Figure 2:
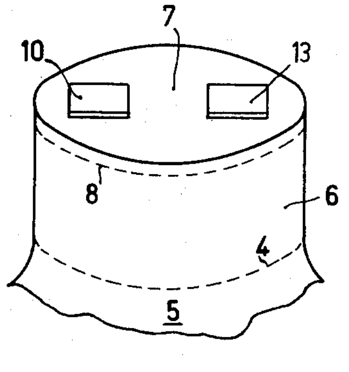

FIG. 2 shows the same transistor as FIG. 1b in a perspective view.

The manufacture of a transistor, of the so-called mesa-type, by means of the method according to the invention will now be described in detail with reference to these figures.

The process starts from a p-type germanium wafer 1, having a concentration of about $10^{15}$ acceptor atoms/cm.$^3$. The concentration level is indicated in FIG. 1a by the broken line 2. The wafer is heated in a conventional manner in a bipartite furnace at 700° C. for one hour in the presence of a quantity of arsenic, which is heated at about 50° C. to 100° C., so that a comparatively low vapour pressure of arsenic prevails in the ambience of the germanium wafer. The arsenic diffuses into the germanium body and forms to a depth of about 1$\mu$ a collector junction (pn-junction). In FIG. 1b the part of the wafer essential for the transistor is shown in a sectional view, in which the arsenic diffusion extends from the upper face 3 of the germanium wafer 1, whilst at a depth of about 1$\mu$ a pn-collector junction 4 is formed. The semi-conductor material beneath the broken line 4, shown partly, constitutes the p collector zone 5 and the part 6 lying above said broken line 4 is intended for the n-type base zone.

At the termination of the first diffusion step, whilst the germanium is still at the temperature of about 700° C., the temperature of the quantity of arsenic is raised to about 300° C. for the second diffusion step, which takes about 5 to 10 minutes. During the second diffusion step a surface layer 7 of a strongly increased arsenic concentration is obtained owing to the considerable higher vapour pressure of the arsenic, but owing to the short duration of the step it has a thickness of only 0.1$\mu$ approximately.

The result of these two diffusion steps is a base zone consisting of two layers 6 and 7 of different concentrations, which appears from FIG. 1a, in which the variation of the arsenic concentration is plotted on the absissa and the penetration depth D is plotted on the ordinate. At the surface of the body there is a layer having a strongly increased concentration (line 9 indicates the course) lying between about $10^{19}$ and $10^{16}$ arsenic atoms/cm.$^3$, due to the second diffusion step. The broken line 8 indicates in these figures the limit of the region of higher concentration. Beneath this limit 8 a considerably less steep concentration variation 9b extends via a kink in the concentration line up to the collector junction 4, said concentration dropping over a distance of about 0.9$\mu$ only from about $10^{16}$ to $10^{15}$ arsenic atoms/cm.$^3$. The variation of the curve 9b results from the first diffusion step, which is carried out at a lower arsenic pressure for a longer time.

To the base zone (6, 7) is then applied, for the manufacture of an emitter contact 10 with the associated emitter zone 11, an aluimnum layer by vaporisation, which is alloyed to a depth of about 0.15$\mu$ in known manner, the p-type recrystallised emitter zone 11 and the aluminum emitter contact 10 being thus formed. The emitter junction 12 thus penetrates through the surface layer 7 into the layer 6 with a smooth variation of a low concentration. The base contact 13 with the associated n-type recrystallised layer 14 may be obtained in known manner by vaporisation and alloying of a gold-antimony alloy. The penetration depth of the base contact (13, 14) may be smaller than the penetration depth of the surface layer 7, for example 0.1$\mu$ or less or it may be greater, if desired. FIG. 2 shows the same transistor structure in a perspective view, in which corresponding parts are designated by the same reference numerals.

It will be obvious that owing to the strongly increased concentration of impurity in the shallow surface layer 7 (of 0.1$\mu$) of the base zone around the emitter contact 10 and the emitter zone 11 a layer having a very low resistivity is formed, which ensures a low base resistance. The penetration depth of the surface layer 7, however, is smaller than that of the emitter zone 11, which is mainly in contact with material of comparatively high resistivity. Thus the emitter properties, particularly the emitter injection efficiency, are particularly favourable. If desired, the contact between the emitter zone and the emitter contact with the high-doped layer may be completely interrupted by etching a shallow groove around the emitter in known manner. The concentrations (9a, 9b in FIG. 1a) in the layers 7 and 6 respectively (see FIG. 1b) can be controlled independently of each other by using the invention, so that on the one hand a low base resistance is obtained, which is highly independent of the emitter injection efficiency, and on the other hand a high emitter injection efficiency is obtained, which is highly independent of the base resistance. Since the emitter electrode is alloyed across the surface layer 7 into the region 6 with a lower concentration decline, the reproduceability is enhanced. The method according to the invention is therefore particularly suitable for an economic mass production of diffusion transistors with considerable advantages as compared with the known methods. The transistor may otherwise be provided in known manner with a collector contact and be finished.

It should finally be noted that the invention is, of course, not restricted to the embodiments described above and that within the scope of the invention many variants are at the expert's disposal. The base contact and the emitter contact, for example, may be shaped in a different form, one contact being, for example, concentric inside the other. For a further facilitation of the mass production of identical transistors a semi-conductor plate may be used, which is sufficiently large to be divided afterwards into a great number of transistor wafers, said plate being first subjected to the treatment according to the invention and then being divided into a number of separate, identical transistors, which are treated simultaneously and in the same manner up to the moment of dividing. Moreover, the parts lying beyond the direct surroundings of the emitter contact and the base contact may be removed from the base zone, so that the known mesa transistor is obtained. As a further alternative, the method according to the invention may also be employed in the manufacture of so-called planar transistors, in which method the semi-conductor wafer is provided with a resist layer, for example an oxide layer prior to the diffusion, in order to restrict the diffusion to given surface parts.

What is claimed is:

1. A method of manufacturing a transistor, comprising the steps of diffusing an impurity of one conductivity-forming type into a region of a semiconductive body of the opposite conductivity type to form a first base zone of said one type and of substantial thickness having a relatively low concentration of said impurity of said one type, thereafter forming on said first base zone a second surface base zone having a thickness smaller than that of said first base zone and having a concentration of impurity of said one type considerably greater than that present in said first base zone, contacting the surface of the second base zone with the higher impurity concentration to form a base connection and contacting the adjacent original region of the body to form a collector connection, and alloying an impurity of said opposite conductivity type into and through the second base zone to form within the first base zone an emitter region of said opposite conductivity type forming an emitter junction with the first base zone containing the lower impurity concentration, whereby the resultant transistor exhibits high emitter efficiency and low base resistance.

2. A method as set forth in claim 1 wherein the second base zone is formed by a second diffusion of the same impurity of the said first type used in producing the first base zone.

3. A method as set forth in claim 2 wherein during the first diffusion step forming the first base zone, the impurity is supplied from a source heated at an elevated temperature, and during the second diffusion step forming the second base zone, the impurity source is heated at a temperature higher than the temperature maintained while the first base zone is formed, said second diffusion step having a shorter duration than the first diffusion step.

4. A method as set forth in claim 3 wherein the semiconductive body is of p-type Ge, the impurity is arsenic, the first diffusion step is carried out for a relatively long time with the Ge body at a temperature of about 700° C. and with the arsenic source at a temperature of about 50° C. to 100° C., and the second diffusion step is carried out for a relatively short time with the Ge body at about the same temperature and with the arsenic source at a temperature of about 300° C.

5. A method as set forth in claim 1 wherein the second base zone is epitaxially grown from a vapor of the semiconductive material.

6. A method as set forth in claim 1 wherein the second base zone is epitaxially grown from a melt of the semi-conductive material.

7. A method of manufacturing a transistor, comprising the steps of diffusing an impurity of one conductivity-forming type into a region of a semiconductive body of the opposite conductivity type to form a first base zone of said one type and of substantial thickness having a relatively low concentration of said impurity of said one type, thereafter forming on said first base zone a second surface base zone having a thickness of about one-tenth that of said first base zone and having a concentration of impurity of said one type considerably greater than that present in said first base zone, contacting the surface of the second base zone with the higher impurity concentration to form a base connection and contacting the adjacent original region of the body to form a collector connection, and alloying an impurity of said opposite conductivity type into and through the second base zone to form within the first base zone to a depth of about one-half the thickness of the second base zone an emitter region of said opposite conductivity type forming an emitter junction with the first base zone containing the lower impurity concentration, whereby the resultant transistor exhibits high emitter efficiency and low base resistance.

8. A method as set forth in claim 7 wherein the impurity concentration of said one-type impurity in the second base zone lies approximately in the range of $10^{19}$ to $10^{16}$ atoms per cubic centimeter, and the said impurity concentration in the first base zone is approximately in the range of $10^{16}$ to $10^{15}$ atoms per cubic centimeter.

References Cited in the file of this patent

UNITED STATES PATENTS 3,028,655 Dacey et al. ------------ Apr. 10, 1962

OTHER REFERENCES

Lehovic et al.: "Gaseous Diffusion of Arsenic and Phosphorus into Germanium," Journal of the Electrochemical Society, vol. 108, No. 6, June 1961, pp. 552–558. Dates relied on are May 3–7, 1959, and May 1–5, 1960, on which articles were presented.